(12) United States Patent
Jang et al.

(10) Patent No.: US 6,403,156 B2
(45) Date of Patent: Jun. 11, 2002

(54) METHOD OF FORMING AN A1203 FILM IN A SEMICONDUCTOR DEVICE

(75) Inventors: Hyuk Kyoo Jang, Sungnam-Shi; Chan Lim, Ichon-Shi, both of (KR)

(73) Assignee: Hyundai Electronics Industries Co., Ltd., Hyungki-do (KR)

( * ) Notice: Subject to any disclaimer, the term of this patent is extended or adjusted under 35 U.S.C. 154(b) by 0 days.

(21) Appl. No.: 09/883,581

(22) Filed: Jun. 18, 2001

(30) Foreign Application Priority Data

Jun. 28, 2000 (KR) ......................................... 2000-36050

(51) Int. Cl.$^7$ ......................... C23C 16/06; C30B 29/20; H01L 21/20; H01L 21/26
(52) U.S. Cl. .................. 427/255.34; 117/950; 438/481
(58) Field of Search ......................... 427/248.1, 255.23, 427/255.26, 255.28, 255.29, 255.31, 255.34; 117/88, 104, 950; 428/688, 689; 438/104, 478, 479, 481

(56) References Cited

U.S. PATENT DOCUMENTS 6,124,158 A * 9/2000 Dautartas et al. ........... 438/216

* cited by examiner

Primary Examiner—Timothy Meeks
Assistant Examiner—William Phillip Fletcher, III
(74) Attorney, Agent, or Firm—Marshall, Gerstein, & Borun

(57) ABSTRACT

A method is disclosed for forming an aluminum oxide film on a semiconductor device. In a process of depositing an aluminum oxide film by atomic layer deposition method using TMA (trimethyl aluminum; $Al(CH_3)_3$) as an aluminum source and $H_2O$ as an oxygen reaction gas, the disclosed method supplies a $NH_3$ reaction gas at the same time when an aluminum source is supplied. Therefore, it can increase the growth rate of an aluminum oxide film and can also improve the characteristic of preventing penetration of hydrogen into an underlying layer or a semiconductor substrate. Thus, the disclosed method can prevent degradation in a charge storage characteristic in a capacitor and lower in an electrical characteristic of various elements, thus improving an overall characteristic of a semiconductor device.

13 Claims, 2 Drawing Sheets

METHOD OF FORMING AN Al2O3 FILM IN A SEMICONDUCTOR DEVICE

BACKGROUND OF THE INVENTION

1. Field of the Invention

The invention relates generally to a method of manufacturing an aluminum oxide film in a semiconductor device. More particularly, the invention relates to a method of manufacturing an aluminum oxide film in a semiconductor device, which can increase the growth rate of an aluminum oxide layer and can also improve prevention of penetration of hydrogen into an underlying layer or an aluminum oxide ($Al_2O_3$) film.

2. Description of the Prior Art

A process of forming an aluminum oxide film by atomic layer deposition method includes sequentially exposing an aluminum source gas and an oxygen gas to a substrate, while a substrate is maintained at a constant temperature, i.e., from 200° C. to about 450° C. TMA is used as a conventional aluminum source gases and $H_2O$ is used as a reactive gas.

A method of manufacturing an aluminum oxide film in a conventional semiconductor device will be below explained by reference to FIG. 1.

Referring now to FIG. 1, a process of forming an aluminum oxide ($Al_2O_3$) film includes a supply step of an aluminum source (A1), a first purge step (B1), a supply step of oxygen reactive gas (C1) and a second purge step (D1). One cycle consists of the four steps (A1, B1, C1 and D1). First, in order to form an aluminum oxide ($Al_2O_3$) film using an atomic layer deposition method, a semiconductor substrate is mounted into the reactor in which an exhaust pump is equipped and is maintained at the temperature range of 200° C. to about 450° C.

In the supply step of an aluminum source (A1), TMA, being an aluminum source, is supplied into the reactor for 0.1 second to 3 seconds, so that aluminum (Al) can be adhered to the surface of the semiconductor substrate.

In the first purge step (B1), in order to remove un-reacted aluminum source gas and reaction by-products, a $N_2$ gas is implanted for 0.1 second to 3 seconds or is vacuum-purged to exhaust via the exhaust pump.

In the supply step of oxygen gas (C1), oxygen reaction gas is supplied in the reactor for 0.1 second to 3 seconds, so that oxygen (O) can be adhered to the surface of the semiconductor substrate.

In the second purge step (Dl), in order to remove un-reacted oxygen reaction gas and reaction by-products, a $N_2$ gas is implanted for 0.1 second to 3 seconds or is vacuum-purged to exhaust via the exhaust pump.

In order to form an aluminum oxide film to a desired thickness, the four steps forming one cycle are repeatedly performed until a desired thickness is attained.

Because the deposition rate is slow in view of atomic layer deposition method, when being applied to a mass production process, the method described in FIG. 1 is disadvantageous in terms of cost and further a conventional aluminum oxide film is not provided to prevent any diffusion of hydrogen atoms.

SUMMARY OF THE DISCLOSURE

A method of manufacturing an aluminum oxide film in a semiconductor device is disclosed which can increase the growth rate of an aluminum oxide film and which can improve the characteristics thereof by prohibiting penetration of hydrogen. By supplying a $NH_3$ activation gas simultaneously with an aluminum source gas in a supply step of an aluminum source, the disclosed method prevents any degradation of electrical characteristics of the layer overlying an aluminum oxide film and improves the electrical characteristics of the semiconductor device.

One disclosed method of manufacturing an aluminum oxide film in a semiconductor device is characterized in that it comprises a first step of simultaneously supplying an aluminum source gas and an activation gas into a reactor via individual lines in which a substrate is mounted; a second step of removing un-reacted aluminum source and reaction by-products from said reactor; a third step of supplying oxygen reaction gas into the reactor; a fourth step of removing un-reacted oxygen gas from the reactor; and a fifth step of repeatedly performing the first step through the fourth step constituting one cycle for depositing an aluminum oxide film to thus form the aluminum oxide film.

In the above step, the reactor is maintained at the temperature ranging from about 200° C. to about 450° C.

The aluminum source is supplied into the reactor using TMA or MTMA for a time period ranging from about 0.1 second to about 3 seconds.

The activation gas is $NH_3$ gas and is supplied into the reactor at a flow rate ranging from about 10 sccm to about 500 sccm for a time period ranging from about 0.1 second to about 3 seconds.

The second step or the fourth step purges the reactor by supplying $N_2$ gas for a time period ranging from about 0.1 second to about 3 seconds.

The oxygen reaction gas is supplied in to the reactor using $H_2O$ vapor for a time period ranging from about 0.1 second to about 3 seconds.

The aluminum oxide film can be formed by supplying the $NH_3$ activation gas in the second step or the fourth step instead of supplying in the first step.

Another method of manufacturing an aluminum oxide film in a semiconductor device is characterized in that it comprises a first step of supplying an aluminum source into a reactor in which a substrate is mounted; a second step of removing un-reacted aluminum source and reaction by-products from the reactor; a third step of supplying oxygen reaction gas and an activation gas into the reactor; a fourth step of removing un-reacted oxygen gas from the reactor; and a fifth step of repeatedly performing the first step through the fourth step constituting one cycle for depositing an aluminum oxide film to thus form the aluminum oxide film.

The reactor is maintained at the temperature ranging from about 200° C. to about 450° C.

The aluminum source is supplied into the reactor using TMA or MTMA for a time period ranging from about 0.1 second to about 3 seconds.

The activation gas is $NH_3$ gas and is supplied into the reactor at a flow rate ranging from about 10 sccm to about 500 sccm for a time period ranging from about 0.1 second to about 3 seconds.

The second step or the fourth step purges the reactor by supplying $N_2$ gas for a time period ranging from about 0.1 second to about 3 seconds.

The oxygen reaction gas is supplied in to the reactor using $H_2O$ vapor for a time period ranging from about 0.1 second to about 3 seconds.

The $NH_3$ activation gas is supplied in the second step or the fourth step instead of supplying $NH_3$ in the third step.

BRIEF DESCRIPTION OF THE DRAWINGS

The aforementioned aspects and other features of the disclosed method will be explained in the following description, taken in conjunction with the accompanying drawings, wherein.

DETAILED DESCRIPTION OF THE PRESENTLY PREFERRED EMBODIMENTS

Various aspects of the disclosed method will be described in detail by way of a preferred embodiment with reference to accompanying drawings.

Figure 1:
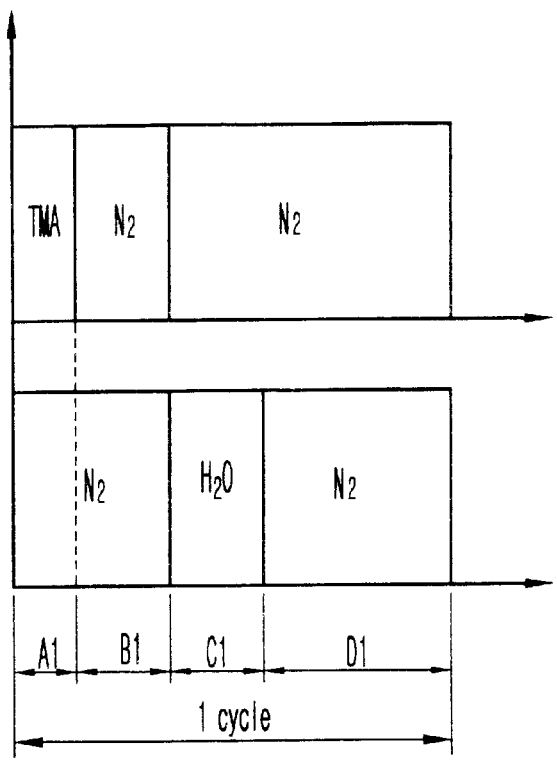
FIG. 1 is a process diagram for explaining a method of manufacturing an aluminum oxide film in a conventional semiconductor device.
Figure 2:
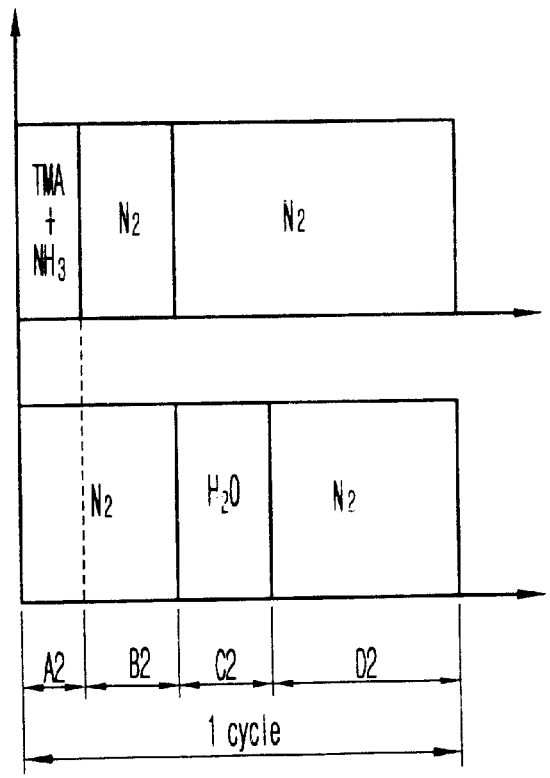
FIG. 2 is a process diagram for explaining a disclosed method of manufacturing an aluminum oxide film in a semiconductor device.

FIG. 2 is a process recipe for explaining a method of manufacturing an aluminum oxide film in a semiconductor device.

Referring now to FIG. 2, a process of forming an aluminum oxide ($Al_2O_3$) film includes a supply step of an aluminum source (A2), a first purge step (B2), a supply step of oxygen reactive gas (C2) and a second purge step (D2), wherein one cycle comprises the four steps (A2, B2, C2 and D2). First, in order to form an aluminum oxide ($Al_2O_3$) film using an atomic layer deposition method, a semiconductor substrate is mounted into the reactor in which an exhaust pump is equipped and is maintained at the temperature ranging from about 200° C. to about 450° C.

In the supply step of an aluminum source (A2), TMA and $NH_3$, being aluminum sources, are simultaneously supplied into the reactor for a time period ranging from about 0.1 second to about 3 seconds, so that aluminum (Al) can be adhered to the surface of the semiconductor substrate. The $NH_3$ activation gas is supplied at the flow rate ranging from about 10 sccm to about 100 sccm and, if necessary, may be supplied at the flow rate ranging from about 10 sccm to about 100 sccm. As the $NH_3$ activation gas is supplied simultaneously with the aluminum source gas, they may react within the supply line. In order to prevent this reaction, it is recommended that the $NH_3$ activation gas and the aluminum source gas be supplied via different supply lines.

In the first purge step (B2), in order to remove un-reacted aluminum source gas and reaction by-products, a $N_2$ gas is implanted for a time period ranging from about 0.1 second to about 3 seconds or is vacuum-purged to exhaust via the exhaust pump.

In the supply step of oxygen gas (C2), oxygen reaction gas is supplied in the reactor for a time period ranging from about 0.1 second to about 3 seconds, so that oxygen (O) can be adhered to the surface of the semiconductor substrate.

In the second purge step (D2), in order to remove un-reacted oxygen reaction gas and reaction by-products, a $N_2$ gas is implanted for a time period ranging from about 0.1 second to about 3 seconds or is vacuum-purged to exhaust via the exhaust pump.

In order to form an aluminum oxide film to a desired thickness, the four steps (A2, B2, C3 and D2) forming one cycle are repeatedly performed until a desired thickness is attained.

Figure 3:
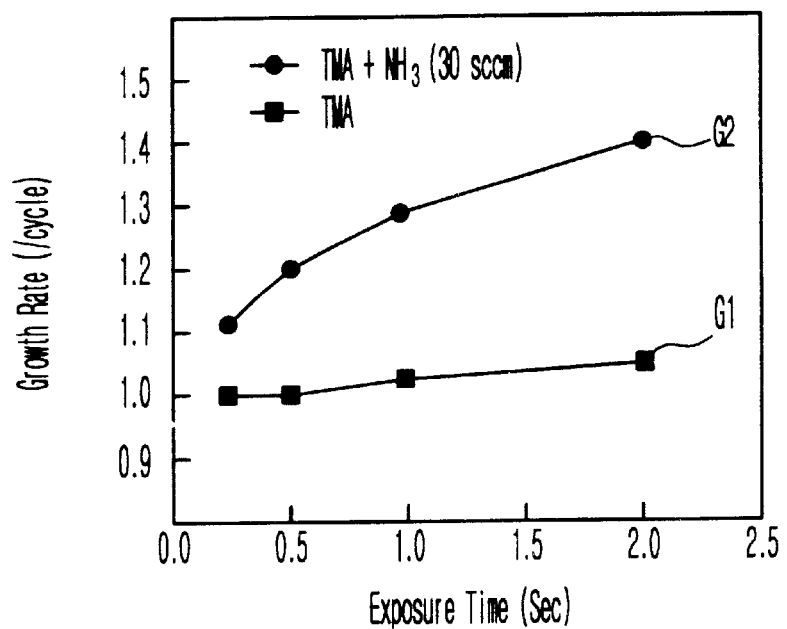
FIG. 3 illustrates, graphically, a comparison of the growth rate depending on the type of gas and an exposure time when an aluminum oxide film is grown.

FIG. 3 is a characteristic graph shown to compare the growth rate depending on the type of gas and an exposure time when an aluminum oxide film is grown.

In the drawing, a reference numeral G1 indicates a growth rate characteristic curve of a conventional aluminum oxide film, which shows that the growth rate of the case that only TMA, being an aluminum source, is supplied to form an aluminum oxide film.

On the other hand, a reference numeral G2 indicates a growth rate characteristic curve of an aluminum oxide film according to the disclosed method, which shows that the growth rate of the case that only TMA and $NH_3$ activation gas at a flow rate of 30 sccm, being an aluminum source, is simultaneously supplied to form an aluminum oxide film.

From the drawing, it can be seen that the growth rate of the aluminum oxide by adding the $NH_3$ activation gas to the aluminum source gas is higher that the growth rate of the aluminum oxide film formed only by a conventional aluminum source.

Figure 4:
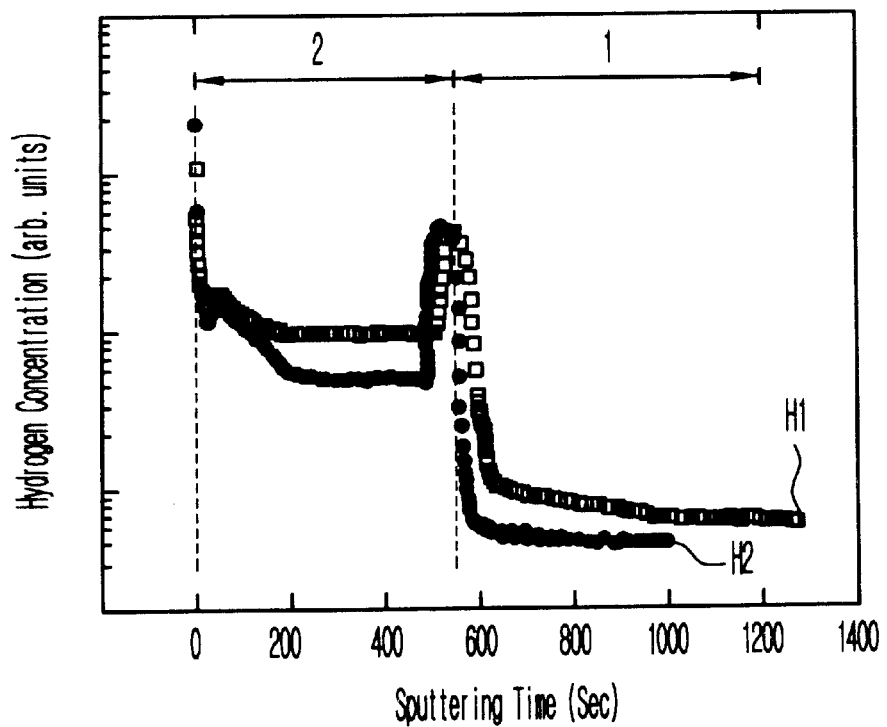
FIG. 4 illustrates, graphically, a comparison of the penetration ratio of hydrogen depending on the type of gas to form an aluminum oxide film.

FIG. 4 is a characteristic graph shown to compare the penetration ratio of hydrogen depending on the type of gas to form an aluminum oxide film.

A reference numeral H1 indicates a hydrogen concentration characteristic curve depending on a conventional hydrogen penetration, and a reference numeral H2 indicates a hydrogen concentration characteristic curve depending on a hydrogen penetration according to the disclosed method. This graph is the result of an experiment for examining the effect of penetration prohibition of hydrogen atoms into an aluminum oxide film for a capacitor in a high-integration memory device such as DRAM, FeRAM, etc. The experiment process includes forming an aluminum oxide film on a semiconductor substrate in thickness of about 50 nm by a conventional method and a method according to the disclosed method, and generating plasma to penetrate hydrogen atoms into the aluminum oxide film. For generation of plasma, a power of about 500 W is applied in the RF reactor and the exposure time is about 100 seconds.

From the drawing, it can be seen that, as a result of measuring the concentration of hydrogen within the semiconductor substrate region 1 and the aluminum oxide film 2, the effect of hydrogen prohibition of the aluminum oxide film formed according to the disclosed method is superior to the aluminum oxide film formed according to the conventional method.

Alternatively, in the above embodiment, the $NH_3$ activation gas is not supplied simultaneously with the aluminum source, but $H_2O$ may be simultaneously supplied with the aluminum source in the supply step of oxygen reaction gas. Also, the $NH_3$ activation gas is not supplied simultaneously with the aluminum source or $H_2O$, but $N_2$ gas may be simultaneously with the aluminum source in the first purge step or in the second purge step to form an aluminum oxide film.

As mentioned above, the disclosed method supplies a $NH_3$ activation gas simultaneously with an aluminum source when an aluminum oxide film is formed. Therefore, the disclosed method can improve the growth rate and also improve the characteristic of prohibiting penetration of hydrogen atoms, thus improving an electrical characteristic of a semiconductor device.

The disclosed method has been described with reference to a particular embodiment in connection with a particular application. Those having ordinary skill in the art and access to the teachings of the disclosed method will recognize additional modifications and applications within the scope thereof.

It is therefore intended by the appended claims to cover any and all such applications, modifications, and embodiments within the scope of the disclosed method.

What is claimed:

1. A method of forming an aluminum oxide film on a substrate, comprising:

a first step of simultaneously supplying an aluminum source and $NH_3$ gas via individual lines into a reactor in which a substrate is mounted;

a second step of removing un-reacted aluminum source gas and reaction by-products from said reactor;

a third step of supplying oxygen reaction gas into said reactor;

a fourth step of removing un-reacted oxygen gas from said reactor; and a fifth step of repeatedly performing said first step through said fourth step to form an aluminum oxide film on the substrate.

2. The method of claim 1, wherein the reactor is maintained at the temperature ranging from about 200° C. to about 450° C.

3. The method of claim 1, wherein the aluminum source is supplied into said reactor using TMA or MTMA for a time period ranging from about 0.1 second to about 3 seconds.

4. The method of claim 1, wherein the $NH_3$ gas is supplied into said reactor at a flow rate ranging from about 10 sccm to about 500 sccm for a time period ranging from about 0.1 second to about 3 seconds.

5. The method of claim 1, wherein the second step or the fourth step purges said reactor by supplying $N_2$ gas for a time period ranging from about 0.1 second to about 3 seconds.

6. The method of claim 1, wherein the oxygen reaction gas is supplied in to the reactor using $H_2O$ vapor for a time period ranging from about 0.1 second to about 3 seconds.

7. A method of forming an aluminum oxide film on a substrate, comprising:

a first step of supplying an aluminum source into a reactor in which a substrate is mounted;

a second step of removing un-reacted aluminum source and reaction by-products from said reactor;

a third step of supplying oxygen reaction gas and $NH_3$ gas into said reactor;

a fourth step of removing un-reacted oxygen gas from said reactor; and a fifth step of repeatedly performing said first step thorough said fourth step to form the aluminum oxide film on the substrate.

8. The method of claim 7, wherein the reactor is maintained at the temperature ranging from about 200° C. to about 450° C.

9. The method of manufacturing an aluminum oxide film on a substrate according to claim 8, wherein the aluminum source is supplied into said reactor using TMA or MTMA for a time period ranging from about 0.1 second to about 3 seconds.

10. The method of claim 8, wherein the activation gas is supplied into said reactor using $NH_3$ gas at the flow rate ranging from about 10 sccm to about 500 sccm for a time period ranging from about 0.1 second to about 3 seconds.

11. The method of claim 8, wherein the $NH_3$ gas is supplied into said reactor at a flow rate ranging from about 10 sccm to about 500 sccm for a time period ranging from about 0.1 second to about 3 seconds.

12. The method of claim 7, wherein the oxygen reaction gas is supplied in to the reactor using $H_2O$ vapor for a time period ranging from about 0.1 second to about 3 seconds.

13. A method of forming an aluminum oxide film on a substrate, comprising:

a first step of supplying an aluminum source into a reactor in which a substrate is mounted;

a second step of removing un-reacted aluminum source and reaction by-products from said reactor;

a third step of supplying oxygen reaction gas into said reactor;

a fourth step of removing un-reacted oxygen gas from said reactor; and a fifth step of repeatedly performing said first step through said fourth step to form an aluminum oxide film on the substrate;

wherein $NH_3$ gas is supplied in the second step or the fourth step.

* * * * *

UNITED STATES PATENT AND TRADEMARK OFFICE
CERTIFICATE OF CORRECTION

PATENT NO.    : 6,403,156 B2
DATED         : June 11, 2002
INVENTOR(S)   : Jung et al.

It is certified that error appears in the above-identified patent and that said Letters Patent is hereby corrected as shown below:

Column 6,
Lines 3 and 4, please delete "thorough" and insert -- through --.

Signed and Sealed this

Third Day of September, 2002

Attest:

Attesting Officer

JAMES E. ROGAN
Director of the United States Patent and Trademark Office